United States Patent [19]

Hayashi et al.

[11] 4,330,329

[45] May 18, 1982

[54] GOLD BONDING WIRE FOR SEMICONDUCTOR ELEMENTS AND THE SEMICONDUCTOR ELEMENT

[75] Inventors: Shozo Hayashi, Tokorozawa; Susumu Tomiyama, Mitaka, both of Japan

[73] Assignee: Tanaka Denshi Kogyo Kabushiki Kaisha, Tokyo, Japan

[21] Appl. No.: 160,302

[22] Filed: Jun. 17, 1980

[30] Foreign Application Priority Data

| Nov. 28, 1979 | [JP] | Japan | 54-153995 |
| Dec. 19, 1979 | [JP] | Japan | 54-166146 |
| Dec. 19, 1979 | [JP] | Japan | 54-166147 |
| Feb. 15, 1980 | [JP] | Japan | 55-18315 |
| Feb. 15, 1980 | [JP] | Japan | 55-18316 |

[51] Int. Cl.$^3$ .............................. C22C 5/00
[52] U.S. Cl. .................... 420/511; 428/620; 428/641; 29/589
[58] Field of Search ............... 75/165; 428/620, 641

[56] References Cited

U.S. PATENT DOCUMENTS

| 3,434,828 | 3/1969 | Cornelison | 75/165 |
| 3,667,937 | 6/1972 | Ingersoll et al. | 75/165 |
| 4,080,485 | 3/1978 | Bonkohara | 75/165 |

FOREIGN PATENT DOCUMENTS

| 2102510 | 7/1972 | France . |
| 52-51867 | 4/1977 | Japan . |

*Primary Examiner*—Upendra Roy
*Attorney, Agent, or Firm*—Birch, Stewart, Kolasch & Birch

[57] ABSTRACT

A bonding gold wire for semiconductor elements comprising a gold alloy containing silver (Ag), calcium (Ca), iron (Fe), and magnesium (Mg) with or without an additional element selected from the group consisting of germanium, beryllium, gallium, and thallium, with the substantial balance being gold.

15 Claims, No Drawings

GOLD BONDING WIRE FOR SEMICONDUCTOR ELEMENTS AND THE SEMICONDUCTOR ELEMENT

BACKGROUND AND SUMMARY OF THE INVENTION

The present invention relates to the use of gold wire for wire bonding to connect a chip electrode of a semiconductor and an external lead.

It is well known that gold alloy is a very suitable material as a bonding wire for semiconductors because of its excellent bonding property, anti-corrosion property, and extensibility.

Previously, a chip electrode of a semiconductor and an external lead have been connected together by pressing a gold ball, which is formed by (1) welding a bonding wire of a gold alloy with an oxyhydrogen flame or (2) electrically, on the chip electrode wherein the lead is maintained at a temperature of 150° C. to 300° C. using a manual or an automatical bonding machine. However, previously used gold wires of less than 50 μmm in diameter are weak in tensile strength and cause breaking of the wire during the wire drawing operation or bonding operation. Also, these gold wires become brittle when the bonding wire is welded, changing from a fibrous crystal structure to a course crystal structure, or form gold balls of different sizes which produce weak bonding strengths.

Heat pressing at a temperature of 150° to 300° C. results in (1) softening of the bonding gold wire and loosening of the bonding gold wire loop connecting the chip electrode and the external lead to cause a short-circuiting of the external lead, (2) molding of the resin resulting in the deformation of the bonding gold wire loop by softening to cause short-circuit by disconnection, or standing results due to gradual decrease of tensile strength of the bonding wire, causing a disconnection.

Accordingly, the bonding wires previously used were analyzed and it was found that the gold contents in the wires were, in general, more than 99.9% by weight and the contents of the residual elements were less than 100 ppm by weight.

The residual elements are present to improve the bonding property, and are included by the incomplete purification of gold, in which the elements are included originally or by the intentional addition of the elements. The components and contents of the residual elements are different depending on the mining districts where the gold was produced and on the intentions with which the manufacturer added the elements. For example, gold alloys containing iron, silver and copper in limited amounts, and calcium, germanium, or lead have been used to improve bonding.

For excellent bonding, the following conditions are required:
(1) High tensile strength,
(2) High tensile strength under high temperatures,
(3) Reduced gradual softening,
(4) Excellent spherical perfectness and evenness in size of the gold ball, and
(5) High bonding strength.

The 5th condition is the most important for semiconductor elements having silicon chip electrodes because this condition greatly influences the semiconducting properties of the silicon after bonding. So many conditions are required for bonding wires that no bonding wire of gold alloy previously provided fulfilled all the conditions mentioned above.

With the status mentioned above in mind, a number of experiments were conducted and measurements were made, and it was found that a bonding gold wire which possessed all five conditions set forth above can not be obtained by only adding elements other than gold but rather by adding specified elements in specified amounts.

All of the five conditions mentioned above are not fulfilled simultaneously by a bonding wire which is produced by the simple addition of elements other than gold because the balance of the elements depends on the mining district of the gold and the purification conditions.

Accordingly, an object of the present invention is to provide a gold wire which fulfills all of the five conditions (1) to (5) mentioned above and which possesses an excellent bonding property.

Another object of the present invention is to provide a semiconductor element having excellent semiconducting properties after bonding.

The gold wire of the present invention comprises desired amounts of four elements, namely silver (Ag), calcium (Ca), iron (Fe), and magnesium (Mg). A composition of five elements comprising said four elements and an additional element selected from the group consisting of germanium (Ge), beryllium (Be), gallium (Ga), and thallium (Tl), and residual amounts of gold. The semiconductor element of the present invention comprises a junction structure of a silicon chip electrode and a bonding gold wire wherein the bonding gold wire comprises said gold alloy of said compositions.

The inclusion of four of five elements comprising Ag, Ca, Fe, Mg, with or without Ge, Be, Ga, or Tl (these elements are named in the first element group) in desired amounts causes the elements to cooperatively keep the balance of the gold wire itself and fulfill the five conditions set forth above.

There are five possible combinations in the present invention, i.e., an Au-Ag-Ge-Ca-Fe-Mg alloy containing the five elements Ag, Ge, Ca, Fe, and Mg; an Au-Ag-Be-Ca-Fe-Mg alloy containing the five elements Ag, Be, Ca, Fe, and Mg; Au-Ag-Ga-Ca-Fe-Mg alloy containing the five elements, Ag, Ga, Ca, Fe, and Mg; Au-Ag-Tl-Ca-Fe-Mg alloy containing the five elements Ag, Tl, Ca, Fe, and Mg, and an Au-Ag-Ca-Fe-Mg alloy containing four elements of Ag, Ca, Fe, and Mg.

Desired composition ranges of the elements for five possible combinations are 20 to 80 ppm by weight of Ag, 5 to 80 ppm by weight of Ge, 1 to 20 ppm by weight of Ca, 0.5 to 10 ppm by weight of Fe, 0.5 to 30 ppm by weight of Mg, and residual amounts of gold for the Au-Ag-Ge-Ca-Fe-Mg alloy; 2 to 80 ppm by weight of Ag, 0.5 to 30 ppm by weight of Be, 1 to 20 ppm by weight of Ca, 0.5 to 50 ppm by weight of Fe, 0.5 to 50 ppm by weight of Mg, and residual amounts of gold for the Au-Ag-Be-Ca-Fe-Mg alloy; 2 to 100 ppm by weight of Ag, 10 to 200 ppm by weight of Ga, 1 to 20 ppm by weight of Ca, 0.5 to 50 ppm by weight of Fe, 0.5 to 50 ppm by weight of Mg, and residual amounts of Au for the Au-Ag-Ga-Ca-Fe-Mg alloy; 2 to 100 ppm by weight of Ag, 10 to 200 ppm by weight of Tl, 1 to 20 ppm by weight of Ca, 0.5 to 50 ppm by weight of Fe, 0.5 to 50 ppm by weight of Mg, and residual amounts of Au for the Au-Ag-Tl-Ca-Fe-Mg alloy; and 2 to 100 ppm by weight of Ag, 1 to 20 ppm by weight of Ca, 0.5 to 50 ppm by weight of Fe, 0.5 to 50 ppm by weight of Mg, and residual amounts of Au for the Au-Ag-Ca-Fe-Mg alloy.

Gold alloys of said combinations including elements of said first element group fulfill the five conditions in the above mentioned composition ranges, but fail to fulfill said conditions in the non-specified composition ranges.

That is, the gold wire including silver (Ag) in amounts less than the specified minimum tends to soften on standing, and more than the maximum, tends to form weak bonding.

The gold wire including germanium (Ge) in amounts less than the specified minimum results in softening, and more than the maximum results in intergranular fracture.

The gold wire including beryllium (Be) in amounts less than the specified minimum results in a reduced tensile strength thereof, wherein the gold wire containing beryllium in more than the specified maximum results in intergranular fracture.

The gold wire including gallium (Ga) in amounts less than the specified minimum results in a reduced tensile strength thereof, whereas gallium present in more than a specified maximum results in intergranular fracture.

The gold wire including thallium (Tl) in amounts less than the specified minimum results in a reduced tensile strength thereof, whereas thallium present in more than a specified maximum results in intergranular fracture.

The gold wire including calcium (Ca) in amounts less than the specified minimum results in a reduced tensile strength thereof under high temperatures, whereas calcium present in more than a specified maximum results in loss of thoughness thereof.

The gold wire including iron (Fe) in amounts less than the specified minimum results in a reduced tensile strength thereof, whereas iron present in more than a specified maximum results in the formation of oxide film on the surface thereof and consequently reduced bonding strength of the bonding formed.

The gold wire including magnesium (Mg) in amounts less than the specified minimum results in reduced tensile strength thereof, whereas magnesium present in more than a specified maximum results in a distorted sphere of the gold ball on welding. The gold wires, i.e., the Au-Ag-Ge-Ca-Fe-Mg alloy, the Au-Ag-Be-Ca-Fe-Mg alloy, the Au-Ag-Ga-Ca-Fe-Mg alloy, the Au-Ag-Tl-Ca-Fe-Mg alloy, and the Au-Ag-Ca-Fe-Mg alloy, possess excellent bonding properties provided the amounts of each element lie in the above mentioned composition ranges. It is desirable that the total contents of said first element group range from the total of the minimum contents of each element to the total of the maximum contents of each element. More particularly, the total contact of Ag, Ge, Ca, Fe, and Mg in the gold wire of Au-Ag-Ge-Ca-Fe-Mg alloy ranges from 9 to 220 ppm by weight; the total content of Ag, Be, Ca, Fe, and Mg in the gold wire of Au-Ag-Be-Ca-Fe-Mg alloy ranges from 4.5 to 230 ppm by weight; the total content of Ag, Ga, Ca, Fe, and Mg in the gold wire of Au-Ag-Ga-Ca-Fe-Mg alloy ranges from 14 to 420 ppm by weight; the total content of Ag, Tl, Ca, Fe, and Mg in the gold wire of Au-Ag-Tl-Ca-Fe-Mg alloy ranges from 14 to 420 ppm by weight; and the total content of Ag, Ca, Fe, and Mg in the gold wire of Au-Ag-Ca-Fe-Mg alloy ranges from 4 to 220 ppm by weight.

Gold alloy is sensible to other elements. Thus, gold wires mass-produced tend to soften on standing if the total contents are less than the minimum values of 9, 4.5, 14, 14, or 4 ppm by weight. On the other hand, gold wires tend to provide distorted gold balls and reduced bonding strength after bonding if the total contents are more than the maximum values of 220, 230, 420, 420, or 220 ppm by weight, respectively.

The extent of the influence of the various elements on the five conditions (1) to (5) of said gold wires, i.e., Au-Ag-Ge-Ca-Fe-Mg alloy, Au-Ag-Be-Ca-Fe-Mg alloy, Au-Ag-Ga-Ca-Ge-Mg alloy, Au-Ag-Tl-Ca-Fe-Mg alloy, and Au-Ag-Ca-Fe-Mg alloy, depends on the elements included. The contents of specified elements in the alloys are in ppm by weight, and performances for bonding wire but not for ordinal gold alloys are required.

Elements which influence the gold alloy to a lesser extent form part of a second element group which include titanium (Ti), copper (Cu), silicon (Si), tin (Sn), bismuth (Bi), manganese (Mn), lead (Pb), nickel (Ni), chromium (Cr), cobalt (Co), aluminum (Al), and palladium (Pd). These elements also have an influence on the five conditions and do not break the balance of the gold wires unless the content of these elements in the alloy exceed 30 ppm by weight.

The elements of the second element group tend to be included in the gold wire through naturally originating influences or artificially originating influences, such as production conditions.

Elements other than the first element group and second element group, that is, elements of a third element group, which adversely influence to a great extent the five conditions required for gold wires are cadmium (Cd), zinc (Zn), antimony (Sb), arsenic (As), and boron (B). Since these elements tend to break down the balance of gold wire alloys, they must be eliminated as much as possible by purification, even though the elements may have been included through artificially originating influences.

The total content of the third element group exceeding an amount of 5 ppm by weight breaks the balance of the gold wire alloys and tends to adversely effect the properties of the gold wire made by mass production.

The gold wire with the above mentioned compositional ranges is advantageously connected to a silicon chip electrode by the heat press method to form a semiconductor. The gold wire of the present invention provides an advantageous gold wire—silicon chip composite when compared with previous gold wires. That is, the prior art gold wires result in a thick junction layer between the gold wire and silicon chip electrode through the thermal influence of bonding and results in a reduced bonding strength. However, the gold wires of the balanced gold alloys of the present invention produce thin junction layers and a high bonding strength because of the inaccessibility to thermal influence, resulting in the production of excellent semiconductor properties.

The invention will be more clearly understood with reference to the following Examples which are merely provided herein as being exemplary of the present invention and for this reason should not be considered as limiting the scope thereof.

EXAMPLE 1

Au-Ag-Ge-Ca-Fe-Mg alloys, namely five elements of Ag, Ge, Ca, Fe, Mg were selected from the first element group, and were casted, and drawn into ultra thin bonding gold wires of 25 μmm in diameter to obtain a number of samples.

Elements included in the samples and the contents thereof are shown in Table 1, in which samples No. 1 to No. 4 are bonding wires according to the present invention and samples No. 5 to No. 8 are for reference.

EXAMPLE 2

Au-Ag-Be-Ca-Fe-Mg alloys, namely the five elements of Ag, Be, Ca, Fe, Mg were selected from the first element group and were melted, casted, and drawn into ultra thin bolding gold wired of 25 μmm in diameter to produce a number of samples.

TABLE 1

| sample No. | the 1st element group (ppm by weight) | | | | | the 2nd element group (ppm by weight) | | the 3rd element group (ppm by weight) |
|---|---|---|---|---|---|---|---|---|
| | Ag | Ge | Ca | Fe | Mg | element | total | |
| this 1 | 2 | 5 | 1 | 0.5 | 0.5 | Cu < 5, Cr < 5 | <30 | <5 |
| in- 2 | 10 | 30 | 3 | 1 | 1 | Si < 5, Sn < 5 | <30 | <5 |
| ven- 3 | 30 | 15 | 2 | 3 | 15 | Cu < 5, Mn < 5, Pb < 5 | <30 | <5 |
| tion 4 | 80 | 80 | 20 | 10 | 30 | Si < 5, Pd < 5 | <30 | <5 |
| ref- 5 | 90 | 20 | | 20 | 1 | Cu < 5, Si < 5 | <30 | <5 |
| er- 6 | 2 | 1 | 1 | 0.5 | 0.5 | Si < 5, Ti < 5 | <30 | <5 |
| ence 7 | 90 | 90 | 5 | 35 | 30 | Co < 5, Cu < 5, Bi < 5 | <30 | <5 |
| 8 | 50 | 10 | 5 | 3 | 20 | Cu(20), Si(5), Pb(5), Ni(5) | >30 | <5 |

The mechanical properties and the other properties of the samples which are required for bonding wire were measured, and the obtained results are given in Table 2. The term "initial" in ③' section of Table 1 means tensile strengths which were measured just after drawing.

The elements included in the samples and the contents thereof are shown in Table 3, in which samples No. 1 to No. 4 are bonding wires according to the present invention and samples No. 5 to No. 8 are for reference. The mechanical properties and other properties of the samples which were measured are provided in Table 4.

TABLE 2

| sample No. | ① tensile strength (g) (elongation constant) | | ② tensile strength at high temp. 250° C. | | ③ change on standing (tensile strength) | | 3' shape of gold ball | ⑤ bonding strength after bonding (g) |
|---|---|---|---|---|---|---|---|---|
| | strength (g) | elongation (%) | strength (g) | elongation (%) | initial (g) | after 48 hr | | |
| this 1 | 9 | 4 | 5 | 5 | 19 | 18.5 | right sphere | 5.5 |
| in- 2 | 10 | 4 | 7 | 2 | 20 | 20 | right sphere | 7 |
| ven- 3 | 10 | 4 | 7 | 2 | 20 | 20 | right sphere | 7 |
| tion 4 | 14 | 4 | 10 | 2 | 21 | 21 | right sphere | 10 0 |
| ref- 5 | 7 5 | 4 | 25 | 5 | 19 | 18 | oxide film formed | 4 6 |
| er- 6 | 6 5 | 4 | 2 | 5 | 19 | 10 | right sphere | 3 |
| ence 7 | 9 | 4 | 3 | 5 | 20 | 20 | distorted oxide film | 2 |
| 8 | 8 | 4 | 30 | 5 | 19 | 18 | distorted | 50 |

TABLE 3

| sample No. | the 1st element group (ppm by weight) | | | | | the 2nd element group (ppm by weight) | | the 3rd element group (ppm by weight) |
|---|---|---|---|---|---|---|---|---|
| | Ag | Be | Ca | Fe | Mg | element | total | |
| this 1 | 2 | 0.5 | 1 | 0.5 | 0.5 | Cu < 5, Si < 5 | <30 | Zn < 5 |
| in- 2 | 10 | 30 | 3 | 1 | 1 | Pd < 5 | <30 | — |
| ven- 3 | 30 | 15 | 2 | 3 | 15 | Si < 5, Pd < 5 | <30 | Sb < 5 |
| tion 4 | 80 | 30 | 20 | 50 | 50 | Bi < 5, Sn < 5 | <30 | Tl < 5 |
| ref- 5 | 90 | 20 | | 20 | 60 | Si < 5, Cu < 5, Pb < 5 | <30 | Cd < 5 |
| er- 6 | 2 | 0.2 | 1 | 0.5 | 0.5 | Ti < 5 | <30 | — |
| ence 7 | 90 | 40 | 5 | 35 | 30 | Bi < 5, Cr < 5 | <30 | Zn < 5 |
| 8 | 70 | 10 | 5 | 3 | 20 | Cu(20), Si(20), Ni(5) | >30 | To < 5 |

TABLE 4

| sample No. | ① strength (g) (elongation constant) | | ② strength at high temp. (250° C.) | | ③ change on standing (tensile strength) | | ④ shape of gold ball | ⑤ bonding strength after bonding (g) |
|---|---|---|---|---|---|---|---|---|
| | strength (g) | elongation (%) | strength (g) | elongation (%) | initial (g) | after 48 hr | | |
| this 1 | 9.5 | 4 | 4.5 | 5 | 20 | 19.5 | right sphere | 5 |
| in- 2 | 12 | 4 | 6.5 | 4 | 21 | 21 | right sphere | 7 |
| ven- 3 | 11 | 4 | 6 | 5 | 20 | 20 | right sphere | 6 |
| tion 4 | 15 | 4 | 11 | 3 | 22 | 22 | right sphere | 9 |
| ref- 5 | 12 | 4 | 2 | 5 | 21 | 21 | distorted | 2.5 |
| er- 6 | 6.5 | 4 | 2.5 | 4 | 19 | 10 | right sphere | 2 |
| ence 7 | 14 | 4 | 3 | 5 | 21 | 21 | distorted oxide film | 3 |
| 8 | 9 | 4 | 3 | 5 | 20 | 20 | distorted | 3.5 |

EXAMPLE 3

Au-Ag-Ga-Ca-Ge-Mg alloys were melted, casted, and drawn into ultra thin bonding gold wires of 25 μmm in diameter, and a number of samples were obtained. The elements included in the samples and the contents thereof are shown in Table 5, in which samples No. 1 to No. 4 are bonding wires according to the present invention and samples No. 5 to No. 8 are for reference. The mechanical properties and other properties of the samples were measured and provided in Table 6.

EXAMPLE 4

Au-Ag-Tl-Ca-Fe-Mg alloys were melted, casted, and drawn into ultra thin bonding gold wires of 25 μmm in diameter, and a number of samples were thus obtained. Elements included in the samples and the contents thereof are shown in Table 7, in which samples No. 1 to No. 4 are bonding wires according to the present invention and samples No. 5 to No. 8 are for reference. The mechanical properties and other properties of the samples measured are shown in Table 8.

TABLE 5

| sample No. | the 1st element group (ppm by weight) | | | | | the 2nd element group (ppm by weight) | | the 3rd element group (ppm by weight) |
|---|---|---|---|---|---|---|---|---|
| | Ag | Ga | Ca | Fe | Mg | element | total | |
| this 1 | 2 | 10 | 1 | 0.5 | 0.5 | Cu < 5, Si < 5 | <30 | <5 |
| in- 2 | 30 | 50 | 5 | 3 | 3 | Mn < 5, B < 5 | <30 | — |
| ven- 3 | 10 | 100 | 2 | 1 | 1 | Cu < 5, Si < 5 | <30 | <5 |
| tion 4 | 100 | 200 | 20 | 50 | 50 | Si < 5, Al < 5 | <30 | <5 |
| ref- 5 | 30 | 20 | — | 70 | 1 | Cu < 5, Zn < 5 | <30 | <5 |
| er- 6 | 2 | 5 | 2 | 0.5 | 0.5 | Mn < 5, Ti < 5 | <30 | — |
| ence 7 | 120 | 220 | 1 | 10 | 20 | Cr < 5, Sn < 5 | <30 | <5 |
| 8 | 50 | 50 | 15 | 35 | 10 | Si(20), Al(20), Ti(5) | >30 | <5 |

TABLE 6

| sample No. | ① strength (g) (elongation constant) | | ② strength at high temp. (250° C.) | | ③ change on standing (tensile strength) | | ④ shape of gold ball | ⑤ bonding strength after bonding (g) |
|---|---|---|---|---|---|---|---|---|
| | strength (g) | elongation (%) | strength (g) | elongation (%) | initial (g) | after 48 hr | | |
| this 1 | 9 | 4 | 5 | 5 | 19 | 13.5 | right sphere | 5.5 |
| in- 2 | 10 | 4 | 7 | 4 | 20 | 20 | right sphere | 7 |
| ven- 3 | 10 | 4 | 8 | 4 | 21 | 21 | right sphere | 8 |
| tion 4 | 14 | 4 | 10 | 4 | 21.5 | 21.5 | right sphere | 9 |
| ref- 5 | 7 | 4 | 25 | 4 | 19 | 17 | distorted | 2.5 |
| er- 6 | 6.5 | 4 | 2 | 5 | 18 | 10 | right sphere | 3 |
| ence 7 | 14 | 4 | 3 | 4 | 21 | 21 | distorted oxide film | 2 |
| 8 | 8 | 4 | 3 | 4 | 20 | 20 | distorted | 3 |

TABLE 7

| sample No. | the 1st element group (ppm by weight) | | | | | the 2nd element group (ppm by weight) | | the 3rd element group (ppm by weight) |
|---|---|---|---|---|---|---|---|---|
| | Ag | Tl | Ca | Fe | Mg | element | total | |
| this 1 | 2 | 10 | 1 | 0.5 | 0.5 | Si < 5, Mn < 5 | <30 | <5 |
| in- 2 | 30 | 50 | 5 | 3 | 3 | Cr < 5, Pb < 5 | <30 | <5 |
| ven- 3 | 10 | 100 | 2 | 1 | 1 | Cu < 5, Mn < 5 | <30 | <5 |
| tion 4 | 100 | 200 | 20 | 50 | 50 | Si < 5, Mn < 5 | <30 | — |
| ref- 5 | 30 | 20 | — | 70 | 1 | Cu < 5, Mn < 5, Si < 5 | <30 | <5 |
| er- 6 | 2 | 5 | 2 | 0.5 | 0.5 | Pd < 5, Si < 5 | <30 | — |
| ence 7 | 120 | 220 | 1 | 10 | 20 | Sn < 5, Cu < 5 | <30 | <5 |
| 8 | 50 | 50 | 15 | 35 | 10 | Cu(25), Si(20), Ti(10) | >30 | <5 |

TABLE 8

| sample No. | ① strength (g) (elongation constant) | | ② strength at high temp. (250° C.) | | ③ change on standing (tensile strength) | | ④ shape of gold ball | ⑤ bonding strength after bonding (g) |
|---|---|---|---|---|---|---|---|---|
| | strength (g) | elongation (%) | strength (g) | elongation (%) | initial (g) | after 48 hr | | |
| this 1 | 9 | 4 | 5 | 5 | 19 | 18.5 | right sphere | 5.5 |
| in- 2 | 10 | 4 | 7.5 | 4 | 20 | 20 | right sphere | 7 |
| ven- 3 | 12 | 4 | 8 | 4 | 21 | 21 | right sphere | 8 |
| tion 4 | 14 | 4 | 11 | 4 | 22 | 22 | right sphere | 10 |
| ref- 5 | 7.5 | 4 | 2.5 | 4 | 19 | 18 | distorted | 2.5 |
| er- 6 | 6.5 | 4 | 2 | 5 | 18 | 10 | right sphere | 3 |
| ence 7 | 15 | 4 | 3 | 4 | 22 | 22 | distorted oxide film | 2 |
| 8 | 12 | 4 | 3 | 4 | 21 | 21 | distorted | 3 |

EXAMPLE 5

Au-Ag-Ca-Ge-Mg alloys, namely the four elements of Ag, Ca, Fe, and Mg selected from the first element group, were melted, casted, and drawn into bonding gold wires of 25 $\mu$mm in diameter, with a number of samples being produced. Elements included in the samples and the contents thereof are shown in Table 9, in which samples No. 1 to No. 4 are bonding wires according to the present invention and samples No. 5 to No. 8 are for reference. The mechanical properties and other properties of the samples measured are shown in Table 10.

TABLE 9

| sample No. | the 1st element group (ppm by weight) | | | | the 2nd element group (ppm by weight) | | the 3rd element group (ppm by weight) |
|---|---|---|---|---|---|---|---|
| | Ag | Ca | Fe | Mg | element | total | |
| this 1 | 2 | 1 | 0.5 | 0.5 | Cr < 5 | <30 | — |
| in- 2 | 20 | 3 | 1 | 1 | Cu < 5, Ti < 5 | <30 | B < 5 |
| ven- 3 | 40 | 10 | 3 | 15 | Si < 5, Cu < 5, Pb < 5 | <30 | Zn < 5 |
| tion 4 | 100 | 20 | 50 | 50 | Cu < 20, Sn < 5 | <30 | Se < 5 |
| ref- 5 | 120 | 3 | 60 | — | Si < 5, Cu < 5, Mn < 5 | <30 | Sb < 5 |
| er- 6 | 1 | 0.5 | 1 | 1 | Cu < 5 | <30 | — |
| ence 7 | 70 | 5 | 5 | 30 | Pd(20), Si(20), Al(5) | >30 | Zn < 5 |
| 8 | 120 | 5 | 70 | 40 | Pd(10), Al(10) | <30 | Cd < 5 |

TABLE 10

| sample No. | ① strength (g) (elongation constant) | | ② strength at high temp. (250° C.) | | ③ change on standing (tensile strength) | | ④ shape of gold ball | ⑤ bonding strength after bonding (g) |
|---|---|---|---|---|---|---|---|---|
| | strength (g) | elongation (%) | strength (g) | elongation (%) | initial (g) | after 48 hr | | |
| this 1 | 9 | 4 | 5 | 5 | 19 | 18.5 | right sphere | 5.5 |
| in- 2 | 10 | 4 | 6.5 | 4 | 20 | 20 | right sphere | 7 |
| ven- 3 | 13 | 4 | 8.5 | 2 | 20 | 20 | right sphere | 8.5 |
| tion 4 | 15 | 4 | 10 | 2 | 21 | 21 | right | 10 |

TABLE 10-continued

| sample No. | ① strength (g) (elongation constant) strength (g) | elongation (%) | ② strength at high temp. (250° C.) strength (g) | elongation (%) | ③ change on standing (tensile strength) initial (g) | after 48 hr | ④ shape of gold ball | ⑤ bonding strength after bonding (g) |
|---|---|---|---|---|---|---|---|---|
| reference 5 | 7.5 | 4 | 3 | 4 | 19 | 17 | sphere distorted | 4 |
| reference 6 | 6.5 | 4 | 2 | 4 | 18 | 10 | right sphere | 2 |
| reference 7 | 7.5 | 4 | 3 | 4 | 19 | 17 | distorted oxide film | 3 |
| 8 | 8 | 4 | 3 | 4 | 20 | 17 | distorted | 4 |

The measurements ①' to ⑤' in Tables (2) (4) (6) (8) (10) of Examples 1 to 5 are measurements which reflect the properties corresponding to the five conditions required for bonding gold wire. From these Tables, it is readily observed that the samples of the present invention show advantageous results with respect to all the measurements 1 to 5 in Tables (2) (4) (6) (8) (10). That is, ① the tensile strength is high; ② the strength at high temperature is high; ③ the softening on standing is reduced; ④ the shape of the gold ball is rightly spherical and even, and ⑤ the bonding strength after bonding is high.

Accordingly, it is readily understood from above Examples that the balanced gold wire of the present invention is excellent in the properties required for bonding gold wire, and provides a high bonding strength and an excellent semiconductor element when the gold wire is welded on a silicon chip electrode to form a junction structure.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A bonding gold wire for semiconductor elements comprising a gold alloy containing 2 to 80 ppm by weight of Ag, 5 to 80 ppm by weight of Ge, 1 to 20 ppm by weight of Ca, 0.5 to 10 ppm by weight of Fe, and 0.5 to 30 ppm by weight of Mg, with the substantial balance being gold.

2. A bonding gold wire for semiconductor elements comprising a gold alloy containing 2 to 80 ppm by weight of Ag, 0.5 to 30 ppm by weight of Be, 1 to 20 ppm by weight of Ca, 0.5 to 50 ppm by weight of Fe, and 0.5 to 50 ppm by weight of Mg, with the substantial balance being gold.

3. A bonding gold wire for semiconductor elements comprising a gold alloy containing 2 to 100 ppm by weight of Ag, 10 to 100 ppm by weight of Ga, 1 to 20 ppm by weight of Ca, 0.5 to 50 ppm by weight of Fe, and 0.5 to 50 ppm by weight of Mg, with the substantial balance being gold.

4. A bonding gold wire for semiconductor elements comprising a gold alloy containing 2 to 100 ppm by weight of Ag, 10 to 200 ppm by weight of Tl, 1 to 20 ppm by weight of Ca, 0.5 to 50 ppm by weight of Fe, and 0.5 to 50 ppm by weight of Mg, with the substantial balance being gold.

5. A bonding gold wire for semiconductor elements comprising a gold alloy containing 2 to 100 ppm by weight of Ag, 1 to 20 ppm by weight of Ca, 0.5 to 50 ppm by weight of Fe, and 0.5 to 50 ppm by weight of Mg, with the substantial balance being gold.

6. The bonding gold wire for semiconductor elements as claimed in any one of claims 1 to 5, wherein said gold further includes at least one member selected from the group consisting of titanium (Ti), copper (Cu), silicon (Si), tin (Sn), bismuth (Bi), manganese (Mn), lead (Pb), nickel (Ni), chromium (Cr), cobalt (Co), aluminum (Al), and palladium (Pd), the total contents thereof being not more than 30 ppm by weight.

7. The bonding gold wire for semiconductor elements as claimed in claim 6, wherein said gold further includes impurity elements with the total content thereof being not more than 5 ppm by weight.

8. A semiconductor element comprising a junction structure of a silicon chip electrode and a bonding gold wire, said bonding gold wire containing 2 to 80 ppm by weight of Ag, 5 to 80 ppm by weight of Ge, 1 to 20 ppm by weight of Ca, 0.5 to 10 ppm by weight of Fe, and 0.5 to 30 ppm by weight of Mg, with the substantial balance being gold.

9. A semiconductor element comprising a junction structure of a silicon chip electrode and a bonding gold wire, said bonding gold wire containing 2 to 80 ppm by weight of Ag, 0.5 to 30 ppm by weight of Be, 1 to 20 ppm by weight of Ca, 0.5 to 50 ppm by weight of Fe, and 0.5 to 50 ppm of Mg, with the substantial balance being gold.

10. A semiconductor element comprising a junction structure of a silicon chip electrode and a bonding gold wire, said bonding gold wire containing 2 to 100 ppm by weight of Ag, 10 to 200 ppm by weight of Ga, 1 to 20 ppm by weight of Ca, 0.5 to 50 ppm by weight of Fe, and 0.5 to 50 ppm by weight of Mg, with the substantial balance being gold.

11. A semiconductor element comprising a junction structure of a silicon chip electrode and a bonding gold wire, said bonding gold wire containing 2 to 100 ppm by weight of Ag, 10 to 200 ppm by weight of Tl, 1 to 20 ppm by weight of Ca, 0.5 to 50 ppm by weight of Fe, and 0.5 to 50 ppm by weight of Mg, with the substantial balance being gold.

12. A semiconductor element comprising a junction structure of a silicon chip electrode and a bonding gold wire, said bonding gold wire containing 2 to 100 ppm by weight of Ag, 1 to 20 ppm by weight of Ca, 0.5 to 50 ppm by weight of Fe, and 0.5 to 50 ppm by weight of Mg, with the substantial balance being gold.

13. The semiconductor element as claimed in any one of claims 8 to 12, wherein said gold further includes at least one member selected from the group consisting of titanium (Ti), copper (Cu), silicon (Si), tin (Sn), bismuth (Bi), manganese (Mn), lead (Pb), nickel (Ni), chromium (Cr), cobalt (Co), aluminum (Al), and palladium (Pd), the total contents thereof being not more than 30 ppm by weight.

14. A semiconductor element as claimed in claim 13, wherein said gold also includes impurity elements with the total contents thereof being not more than 5 ppm by weight.

15. A bonding gold alloy having a high tensile strength, a reduced gradual softening, uniformity in size and a high bonding strength comprising 2 to 100 ppm by weight of Ag, 1 to 20 ppm by weight of Ca, 0.5 to 50 ppm by weight of Fe and 0.5 to 50 ppm by weight of Mg, with or without an additional element selected from the group consisting of 5 to 80 ppm by weight of Ge, 0.5 to 30 ppm by weight of Be, 10 to 100 ppm by weight of Ga, and 10 to 200 ppm by weight of Tl, with the substantial balance being gold.

* * * * *